United States Patent [19]

Price

[11] Patent Number: 5,721,424
[45] Date of Patent: Feb. 24, 1998

[54] AVALANCHE PHOTODIODE APPARATUS BIASED WITH A MODULATING POWER SIGNAL

[75] Inventor: Alistair J. Price, Thousand Oaks, Calif.

[73] Assignee: Alcatel Network Systems, Inc., Richardson, Tex.

[21] Appl. No.: 660,867

[22] Filed: Jun. 10, 1996

[51] Int. Cl.$^6$ ...................................................... H01J 40/14
[52] U.S. Cl. ........................................ 250/214 R; 327/514
[58] Field of Search ........................... 250/214 R, 214 A, 250/214 AG; 327/326, 514, 584

[56] References Cited

U.S. PATENT DOCUMENTS 5,023,951  6/1991  Kahn ............................................ 330/59
5,270,533  12/1993  Pulice ..................................... 250/214 R

OTHER PUBLICATIONS

"Statistical Properties of the Impulse Response Function of Double–Carrier Multiplication Avalanche Photodiodes Including the Effect of Dead Space", Journal of Lightwave Technology, vol. 10, No. 10, Oct. 1992, pp. 1415–1425.

Conference on Optical Fiber Communication/International Conference on Integrated Optics and Optical Fiber Communication, 1993 Technical Digest Series, vol. 4, Conference Edition, Feb. 21–26, 1993, pp. 87–92.

*Primary Examiner*—Edward P. Westin
*Assistant Examiner*—Kevin Pyo
*Attorney, Agent, or Firm*—Vinson & Elkins L.L.P.

[57] ABSTRACT

An photodetector circuit comprising an avalanche photodiode having a signal input for receiving an input optical signal to be converted to an electrical signal. The photodetector circuit further includes biasing circuitry, coupled to the avalanche photodiode, for applying a bias voltage to the avalanche diode. The bias circuitry includes: (1) a dc bias circuit for providing a dc component to the bias voltage for maintaining the avalanche diode in a stable avalanche gain condition when receiving the input optical signal; and (2) a modulating circuit for providing a high frequency modulating component to the bias voltage for modulating the bias voltage in a manner that enhances the operational characteristics of the avalanche photodiode. In particular, the modulating component to the bias voltage decrease the noise of the signal output of the avalanche photodiode for a given average gain, and increases the bandwidth of the signal output of the avalanche photodiode for a given average gain.

30 Claims, 4 Drawing Sheets

5,721,424

AVALANCHE PHOTODIODE APPARATUS BIASED WITH A MODULATING POWER SIGNAL

This invention relates to avalanche photodiode apparatus, and is more particularly directed to an avalanche photodiode apparatus which is biased with a modulating power signal.

BACKGROUND OF THE INVENTION

After an optical signal is transmitted through some transmission medium such as an optical fiber, it typically is converted to an electrical signal using an optical detector. One type of optical detector is an avalanche photodiode. Typically, the optical signal is applied to an avalanche photodiode in an electrical circuit with a DC bias voltage applied to the terminals of the avalanche photodiode. Signal currents generated by the avalanche photodiode which are dependent on the incident optical signal are passed to an amplifier. An electrical filter might be used prior to the amplifier and/or subsequent to the amplifier to reduce noise. Such a use of the avalanche photodiode results in sensitivity performance limits dependent on the characteristics of the avalanche photodiode and the signal amplifier used in conjunction with the avalanche photodiode.

The DC bias voltage applied to the avalanche photodiode affects various aspects of operation. For example, if the DC bias voltage is increased, typically both the gain and noise also increase. In addition, as the DC bias voltage is increased, the bandwidth generally decreases, which can limit the usefulness of the device in applications requiring a large bandwidth, such as high bit rate optical transmission systems.

Optical preamplifiers have been used to provide optical gain prior to detection of the optical signal. This can result in a superior electrical signal to noise ratio and better sensitivity performance. Such optical preamplifiers, however, are expensive, consume power, and may be unreliable. Further, when using an optical preamplifier, there is often a requirement of an optical bandpass filter, which filter might need to track the input signal in order to achieve high sensitivity to the optical signal.

An optical bandpass filter, as described above, is a device which removes or at least reduces optical noise generated by the optical preamplifier in a received optical signal. Such an optical bandpass filter is desirable to minimize the unwanted extraneous frequencies that accompany the required signal. However, optical bandpass filters by themselves can be expensive and bulky.

It is therefore an object of the present invention to provide an avalanche photodiode apparatus which overcomes limitations and drawbacks of the prior art.

It is a further object of the present invention to provide such an avalanche photodiode apparatus concerned with a bias technique for enhancing the gain, noise, bandwidth, and sensitivity characteristics of the apparatus.

It is a further object of the present invention to provide such an avalanche photodiode which is biased by a rapidly modulating signal.

It is a further object of the present invention to provide such an avalanche photodiode which addresses the prior art setbacks set forth above but which is usable in an otherwise conventional avalanche photodiode amplifier circuit.

Still other objects and advantages of the present invention will become apparent to those of ordinary skill in the art having references to the following specification together with its drawings.

SUMMARY OF THE INVENTION

The preferred embodiment of the invention includes a photodetector circuit comprising an avalanche photodiode having a signal input for receiving an input optical signal to be converted to an electrical signal. The photodetector circuit further includes biasing circuitry, coupled to the avalanche photodiode, for applying a bias voltage to the avalanche photodiode, wherein said bias voltage comprises a dc component for maintaining said avalanche photodiode in a stable avalanche gain condition when receiving said input optical signal and a high frequency modulating component for enhancing output characteristics of the avalanche photodiode. In the preferred embodiment of the invention, the high frequency is at least 1 GHz but is preferably on the order of a very high frequency of 10 GHz or greater.

The characteristics of the avalanche multiplication process responsible for current gain that occurs when an optical signal is detected is affected by the application of the high frequency modulating component to the bias voltage. In particular, the modulating component to the bias voltage rapidly increases and decreases the avalanche gain of a signal in the avalanche photodiode for a given DC bias voltage. This decreases the noise of the signal output of the avalanche photodiode for a given average gain, and increases the overall bandwidth of the signal output of the avalanche photodiode for a given average gain. Similarly, for a given bandwidth or a given noise, an increased average gain of the circuit may be obtained.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

The preferred embodiment of the present invention and its advantages are best understood by referring to FIGS. 1 through 8 of the drawings.

Figure 1:
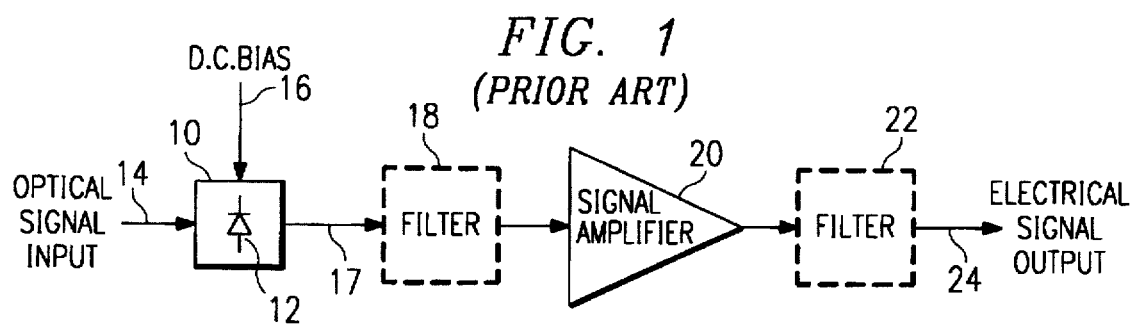
FIG. 1 is a block diagram of a prior art implementation of an avalanche photodiode circuit for converting optical signals to electrical signals.

FIG. 1 illustrates a block diagram of a prior art implementation of an avalanche photodiode circuit for converting optical signals to electrical signals. In FIG. 1, a block 10 includes an avalanche photodiode 12, an optical signal input 14, and a DC bias lead 16. Block 10 provides an output signal on a lead 17 to a filter block 18. The filtered signal is output to a signal amplifier 20. Amplifier 20 outputs the amplified signal to a further filter 22 which outputs an electrical signal output on lead 24. The two filters 18 and 22 may be low-pass, high-pass, bandpass filters or matching circuits as prudent design practices may dictate. It should be noted that while filters 18 and 22 are shown in FIG. 1, they would not be needed for all applications and, therefore, are optional. For example, filter 18 may be omitted from the circuit of FIG. 1. To better illustrate this point, filters 18 and 22 are outlined in dashed lines.

The operation of FIG. 1 is as follows. An optical signal applied to block 10 containing avalanche photodiode 12 causes a given electrical output signal to be applied to filter 18. The amplitude of the signal applied to filter 18 depends upon the DC bias applied to avalanche photodiode 12 on lead 16. The DC bias voltage affects the level of the output signal, and thus could be considered a gain changing device. As demonstrated later in FIGS. 5 through 8, as the DC bias voltage is increased to increase the gain, the bandwidth decreases and the noise increases. The decrease in bandwidth and the increase in noise are both undesirable side effects in most instances. Some of the noise is removed by filters 18 and 22 when present. To obtain more gain, further signal amplification could be inserted within amplifier 20 or in later circuitry. To obtain increased sensitivity to the optical signal input, an optical preamplifier such as an Alcatel Network Systems Inc. device designated as a 1610 OA optical amplifier could be used to amplify the optical signal input to the avalanche photodiode 12. In other words, a preamplifier for optical signals could be used.

Figure 2:
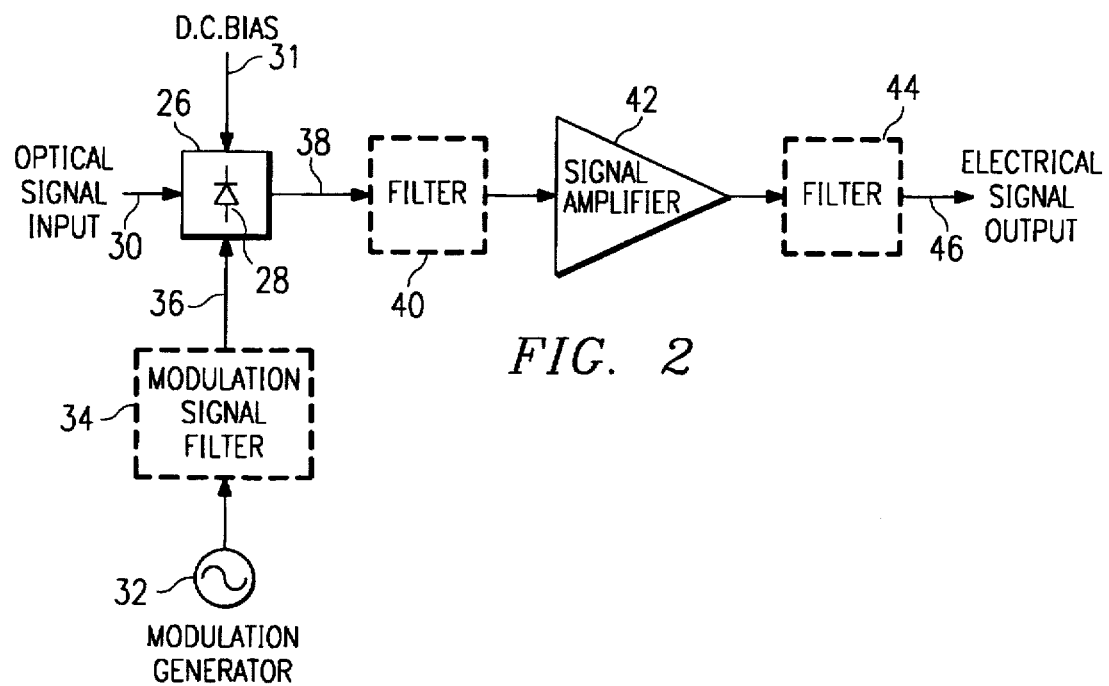
FIG. 2 is a block diagram of the preferred embodiment of the present invention.

FIG. 2 illustrates a block diagram of the preferred embodiment of the present invention. In this description of the preferred embodiment, the term filter is taken to include matching circuits in which a matching circuit comprises one or more frequency dependent elements designed to optimize the transfer of desired signal frequency components between circuit elements while conceivably preventing or impeding the transfer of unwanted frequency components.

In FIG. 2, a block 26, which may be similar to block 10 of FIG. 1, includes an avalanche photodiode 28, an optical signal input 30, and a DC bias lead 31. In addition, a signal is shown from some type of modulation generator 32 supplying a signal through a modulation signal filter 34 to block 26 on a lead 36. A typical avalanche photodiode as shown in block 26 comprises two electrical leads. The DC bias lead 31 and modulation signal lead 36 may be applied to the same avalanche photodiode electrical lead or separate avalanche photodiode electrical leads as may be appropriate for the circuit. To illustrate this flexibility, the DC bias lead 31 and modulation signal lead 36 are shown in FIG. 2 as inputs to the block 26 rather than as attached to any particular electrical lead of the avalanche photodiode.

The modulation signal filter 34 may be a high-pass filter or bandpass filter as appropriate to pass the modulation signal to block 26. In addition, modulation signal filter 34 may be a matching circuit designed to optimize transfer of the modulation signal to the avalanche photodiode while simultaneously blocking the photodiode signals intended to be output on lead 38.

The optical signal detected by avalanche photodiode 28 is converted to an electrical signal and is output from block 26 on a lead 38. Again, the output lead 38 may be attached to either electrical lead of the avalanche photodiode circuit as appropriate for the particular circuit. The output signal from lead 38 is passed to a filter 40, and the filtered signal is then applied to a signal amplifier 42. The output of amplifier 42 is again filtered in a filter 44 before being output on a lead 46 as an electrical signal output representative of the power of the optical signal input at 30.

If present, filters 40 and 44 may be low pass filters or bandpass filters or bandstop filters as appropriate to reject the high frequency modulation signal from the optical signal. In addition, filters 40 and 44 may also be matching circuits that optimize output power of the signal. Note also that in FIG. 2, like in FIG. 1, the filters are optional items and are thus represented by dashed lines.

FIG. 2 can be used in a manner similar to FIG. 1, but due to the implementation of the inventive changes, results in improved operational characteristics. The DC bias on lead 31 maintains the avalanche photodiodes 28 in a stable avalanche gain condition. However, in contrast to FIG. 1, in FIG. 2 a modulation signal, as obtained from modulation generator 32, is superimposed upon the DC bias from lead 31. The modulation signal produces an effective addition in a manner that might be compared to an alternating signal superimposed upon a DC signal. When the amplifier circuit of FIG. 2 is used to convert an optical pulse signal to an electrical signal, the modulation signal frequency is preferably substantially higher than the pulse repetition frequency of the optical signal being converted. The modulation signal will usually be at a high frequency of at least 1 GHz, depending on the pulse repetition frequency. For a pulse repetition frequency of the optical signal of 2.5 GBS, then the modulation frequency is preferably at a very high frequency of about 10 GHz.

With reference to FIG. 2, it has been proven in the lab that, for a given average gain, as obtained by reducing the bias voltage while simultaneously increasing the bias modulation signal, the noise is decreased and the bandwidth is increased. Similarly, the average gain is increased for a given noise or a given bandwidth.

Figure 4:
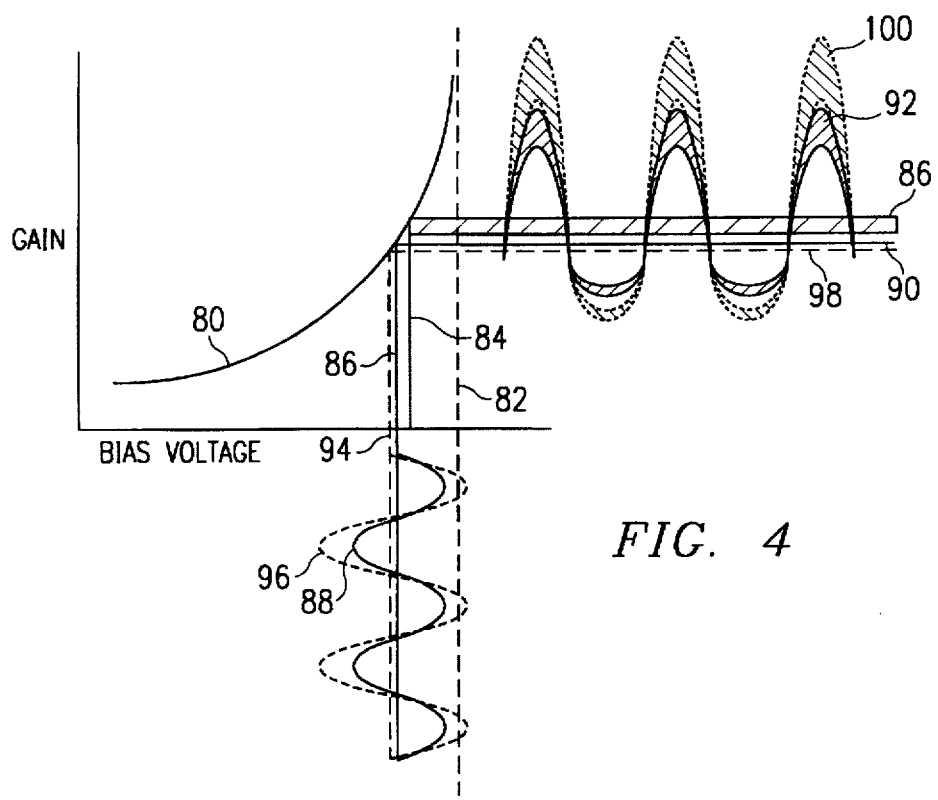
FIG. 4 is a set of waveforms for use in explaining the operation of FIGS. 1, 2 and 3.

It will be apparent to those skilled in the art that in order for optional filters 40 and 44 to provide rejection of the modulation bias signal, the circuitry within optional filters 40 and 44 may need to be slightly more sophisticated than that required in the filters 18 and 22 of the prior art of FIG. 1, but the increased gain, bandwidth, optical signal sensitivity, and/or decreased noise is of sufficient consequence to warrant and economically justify the additional circuitry for filters 40 and 44 as well as the circuitry for modulation generator 32 and optional modulation signal filter 34. Depending upon the test configuration setup, the noted increases in gain have ranged from five to twenty dB. As discussed below, the waveforms 92 and 100 of FIG. 4 illustrate the changes in output between FIG. 1 and FIG. 2 as well as showing two different modulation bias levels for FIG. 2. Although the decrease in noise is not readily apparent to the eye for waveforms 92 and 100 of FIG. 4 as compared to the noise in output 86, lab measurements and theoretical analysis show a decrease in noise and an increase in bandwidth when compared with the prior art. This is illustrated below in the graphs of FIGS. 5, 6, 7 and 8.

The reduction in noise in the operation of FIG. 2 is due to the fact that when the gain is rapidly increased from a small value to a large value, noise, which is due to randomness in the avalanche process, lags behind this rise in gain. For a short period of time, therefore, it is possible to get a large gain together with a lower noise than would occur in normal, steady-state conditions. In order to take advantage of this effect, it is necessary to raise and lower the gain repeatedly. Within limits, the noise factor drops as a function of increasing frequency of modulation bias. Further, when the gain is lowered, the avalanche process dies down fast. Because the duration of a current pulse resulting from an incident optical impulse is now restricted to a great extent by the gain modulation period, a considerable increase in bandwidth results.

Figure 3:
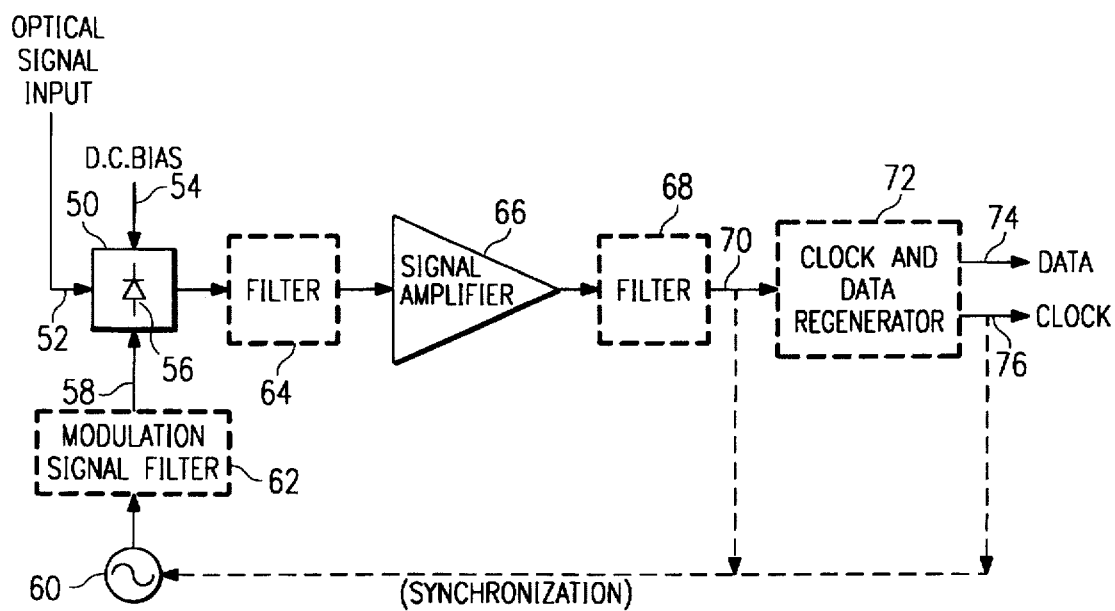
FIG. 3 is an alternative embodiment of the present invention using synchronization between a modulated optical signal and the modulation signal for the DC bias.

FIG. 3 illustrates an alternative embodiment of the present invention using synchronization between a modulated optical signal and the modulation bias signal for the avalanche photodiode. Though FIG. 3 may be used with many types of optical signals, FIG. 3 is preferably used in cases where the optical signal is transmitting digital data in the form of a plurality of pulses at regular intervals called an optical pulse stream. Optical pulse streams may transmit data in the form of return to zero ("RZ") data, non-return-to-zero ("NRZ") data, or soliton data. With RZ data, a logic "1" data pulse returns to zero prior to the end of a clock period, typically halfway through the clock period. A logic "0" data is represented by the absence of an optical pulse. With the second data form, NRZ data, a logic "1" data pulse does not return to zero during the period. The third data form, soliton data, comprises specially shaped, narrow pulses wherein the shape of the pulses resists distortion by counterbalancing the effects of chromatic dispersion and self-phase modulation in the optical transmission fiber.

With reference to FIG. 3, a block 50 is shown with an optical signal input at 52 and a DC bias on lead 54 in a manner similar to that of FIG. 2. Block 50 also contains an avalanche photodiode 56 and receives a modulation input on a lead 58. The signal on lead 58 is generated within a signal generator 60 which passes its output signal through an optional modulation signal filter 62 again in a manner similar to that of FIG. 2. Similarly to modulation signal filter 34, the modulation signal filter 62 may be a high pass filter, bandpass filter, or a matching circuit as appropriate to pass the modulation signal to block 50.

The electrical signal detected by avalanche photodiode 56 is passed through a filter 64 to remove components introduced by modulation generator 60. Filter 64 further passes the signal to a signal amplifier 66 whose output is passed through a further filter 68. Again filter 64 and filter 68 may be low pass or bandpass or bandstop filters or matching circuits as appropriate to filter the modulating components introduced by modulator 60 and to transfer the signal. An output of filter 68 is supplied on a lead 70 to a clock and data regenerator 72, as well as optionally being returned to modulation generator 60 for the purposes of synchronization. The output of block 72 is provided on two leads, one of which is a data signal on lead 74 and the other of which is a clock signal on lead 76. An optional synchronization signal is shown to be taken from leads 70 and 76 to modulation generator 60 to indicate that a suitable signal might be obtained from either point. However, a signal from both sources 70 and 76 is not necessary. The signal returned to modulator 60 would have to be acted upon in a manner known to those skilled in the art to provide the synchronization of the signal generator 60 with the optical pulse signal of lead 52 so as to coordinate the periods of high detector gain with the times of incidence of optical data pulses at the avalanche photodiode 56. In operation, in FIG. 3, the repetition rate of the optical pulse stream is obtained either from the filter 68 or from a clock regenerator 72 and fed back to the modulation generator 60 to create a rising level of bias slightly in advance of the rise in power of the optical pulse stream.

Although FIG. 3 shows a circuit in which synchronization is achieved using a feedback signal originating from the signal detected in the avalanche photodiode 56, other approaches may also be used. FIG. 3 is presented as one example of an embodiment of the present in invention in which the modulating signal is synchronized with the optical pulse data rate. The synchronization may be achieved in any manner in the operation of the preferred embodiment of the invention.

FIG. 4 illustrates a set of waveforms for further explaining the operation of FIGS. 1, 2 and 3. In FIG. 4, a graph is shown with the vertical axis labeled "GAIN" and the horizontal axis labeled "BIAS VOLTAGE". A curve 80 is illustrated representing the optical-to-electrical conversion gain of a typical avalanche photodiode with different bias voltages. A dashed line 82 represents an unstable bias voltage condition called the reverse-bias breakdown voltage of the avalanche photodiode. At this reverse-bias breakdown voltage 82, the current through the avalanche photodiode increases sharply, and relatively large currents can flow with little further increase in voltage. In addition, internal current flowing in response to light input will continue even if the light input is removed.

With reference to the prior art of FIG. 1 and its relationship to FIG. 4, FIG. 4 depicts the bias voltage and corresponding output signal of prior art avalanche photodiode 12. Particularly, a first vertical line 84 represents a given DC bias for prior art avalanche photodiode 12, and a wide horizontal line 86 represents the amplitude of an electrical signal output on lead 17 for a given power input on lead 14. Line 86 is shown as being wide because of the noise that is inherent on the output of block 10.

With reference to the invention shown in FIG. 2 and its relationship to FIG. 4, FIG. 4 further depicts the bias voltage and corresponding output signal of the inventive configuration including avalanche photodiode 28. Particularly, the bias of avalanche photodiode 28 is shown by a bias line 87 and superimposed on bias line 87 is a modulation signal 88. Further, a horizontal line 90 with the superimposed signal 92 represents the amplitude of an electrical signal in the photodiode 28 for a given optical signal input on lead 30. Note that bias 87 is of a lower DC value than the prior art bias 84, but bias 87 still produces the same effective gain as an output signal where the effective electrical output signal is measured to be the same as that provided for the given light input under the prior art DC-only conditions of prior art bias 84. Note further that while output line 90 with superimposed signal 92 includes some noise, it has been found in test measurements that the amount of noise in output signal 92 is substantially less than that of the output represented by prior art output 86. At bias 87 with superimposed modulating signal 88, the avalanche photodiode is operating in an avalanche region of its characteristic. However, the avalanche photodiode has not reached the point of reverse-bias breakdown.

With further reference to the invention shown in FIG. 2 and its relationship to FIG. 4, an alternative embodiment may be constructed to bias avalanche photodiode 28 as shown by dashed line 94 with superimposed dashed line modulating signal 96. It will be noted that the peak of modulating signal 96 exceeds the reverse-bias breakdown voltage 82 for a short amount of time in each cycle. The photodiode electrical output resulting from this even lower bias 94 and 96 is represented by a dashed line 98 and a dashed line modulated output 100. Modulation output 100 has even less total noise output than either waveforms 86 or 92. In addition, modulation output 100 has a wider bandwidth for situations where the input optical signal amplitude changes as a function of time, and the sensitivity to small amounts of optical signal is increased in both 92 and 100 over that obtained in 86.

If the superimposed modulation signals 88 or 96 were used in conjunction with bias 84, it would be apparent that the effective gain could be higher than that of 86. While one might think that increasing the bias through modulation such as 96 to a value which would fall into the reverse-bias breakdown voltage 82 might cause the gain to extend to infinity, this does not happen because within the duration of the positive half-cycle of the modulating signal, there is only sufficient time for the gain to rise to a finite level and it falls again during the negative half-cycle. In addition, there is a lag in noise build-up at high frequencies (in other words, greater than two gigahertz). Noise has to build up over a period of time after current flow has increased. Further, the negative half-cycles of the modulating signal periodically reduce the gain to a low value. It is also believed apparent from the previous discussion that the noise would be lower than would be the case if the bias were increased to obtain that effective gain. Further, the bandwidth would be wider than would be obtainable if the bias were increased to a level to obtain that gain.

Figure 5:
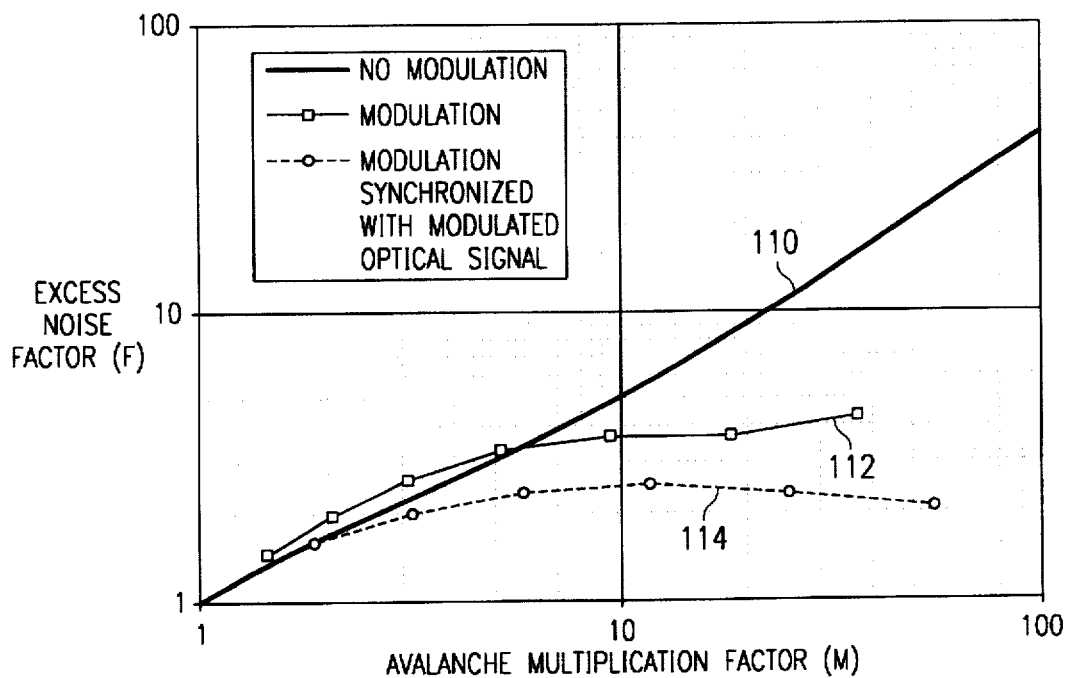
FIG. 5 comprises a graph showing the relative noise improvements for an embodiment of the present invention where the modulation bias signal to the applicable avalanche photodiode is changed in type.
Figure 6:
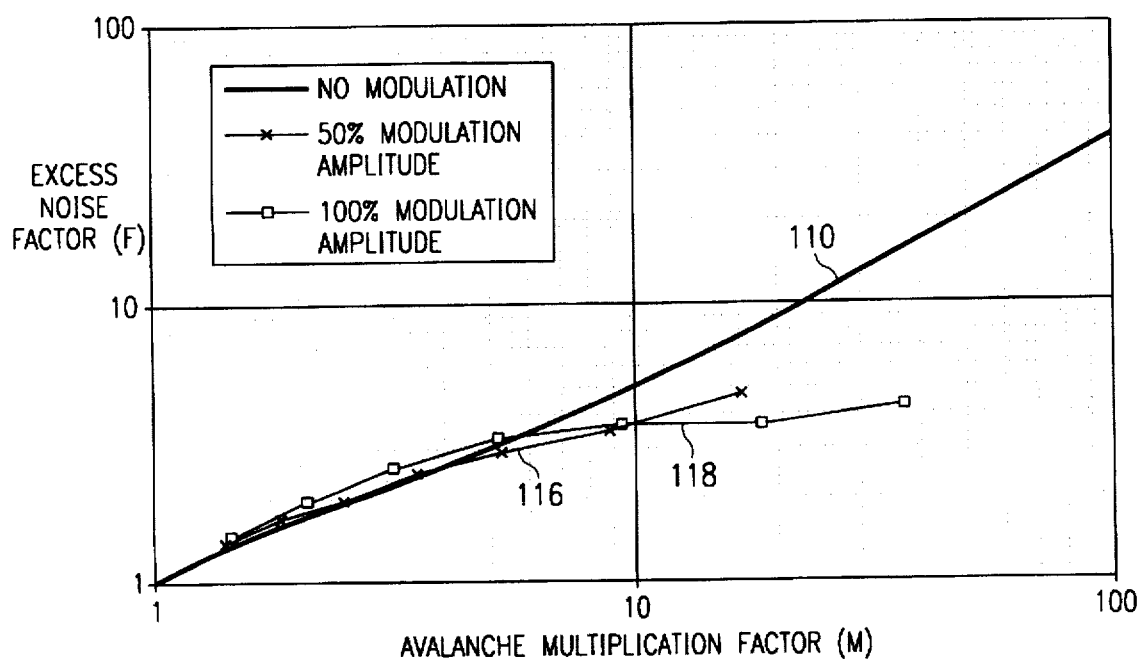
FIG. 6 comprises a graph showing the relative noise improvements for an embodiment of the present invention where the modulation bias signal to the applicable avalanche photodiode is changed in amplitude.
Figure 7:
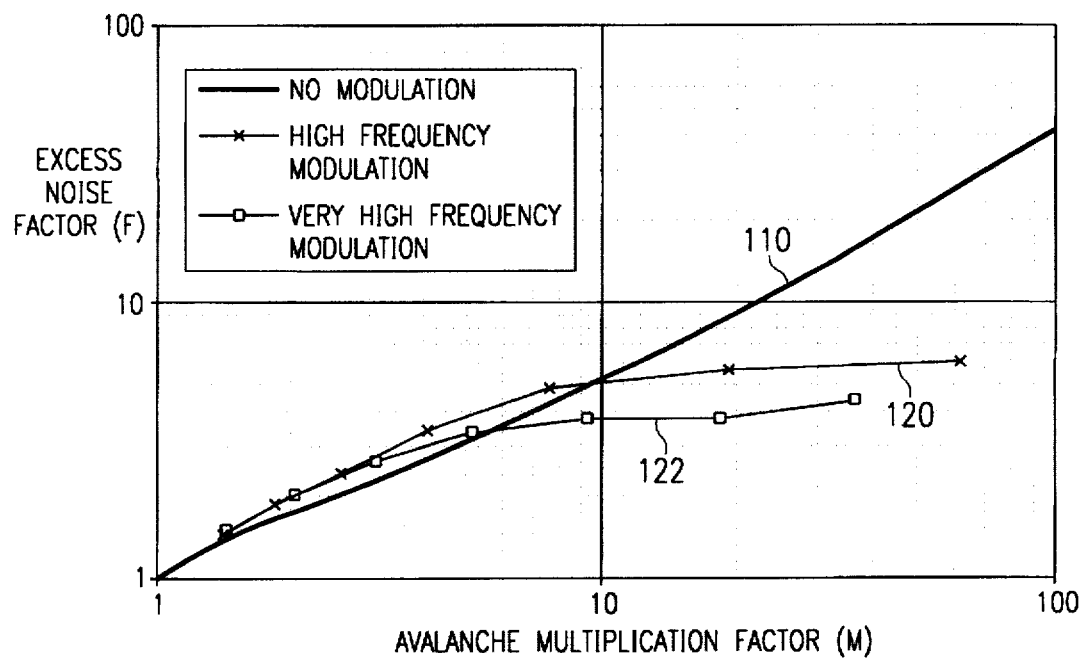
FIG. 7 comprises a graph showing the relative noise improvements for an embodiment of the present invention where the modulation bias signal to the applicable avalanche photodiode is changed in frequency.

FIGS. 5 through 7 comprise sets of waveforms showing the relative noise improvements for various embodiments of the present invention where the modulation bias signal to the applicable avalanche photodiode is changed in type, amplitude, or frequency. The results of FIGS. 5 through 7 were obtained with a particular avalanche photodiode simulation model and thus may vary somewhat for any particular avalanche photodiode. The overall advantages of the present invention however should be consistent with any particular avalanche photodiode. Each of these figures and the corresponding change is discussed separately, below.

In FIG. 5, a graph is shown with the vertical axis representing increasing levels of noise on a logarithmic scale. The noise axis uses the terminology of the industry of "EXCESS NOISE FACTOR" (F). The horizontal axis is also in logarithmic scale and is indicative of gain of an avalanche photodiode but is labeled specifically "AVALANCHE MULTIPLICATION FACTOR" (M). A thick line 110 illustrates the noise for various gain factors, using DC bias only (i.e. no modulation). This curve is known in the industry. Typically, the photodiode would be biased for use between a gain of 3, and a gain of about 20. Above a gain of 20, the noise is so high and the bandwidth is so limited that most circuits will not satisfactorily operate, and other means of amplification of either light or electric signals are typically utilized.

With reference to the other two curves of FIG. 5, modulation bias is indicated by a boxed, data point curve 112, while a modulation bias which is further synchronized with the modulation of the input optical pulse stream (i.e., as in FIG. 3) is represented by a circle data point curve 114. Boxed data point line 112 shows that while noise may start out slightly higher for a given low gain using modulation than occurs with the DC (i.e., non-modulated) bias curve 110, the noise level becomes less for the modulated circuit than the DC bias only at a gain of about 6 on the scale. The noise level remains almost flat from there to the indicated gain of about 36. Circular data point line 114 has less noise than DC bias line 110 from less than a gain of 2 to its maximum data point, indicating a gain of greater than 50. In fact, at the indicated gain of about 55, the noise is less than 1/10 of the noise that would be occurring in the prior art line 110 using DC bias and no modulation. The results may vary somewhat for a particular avalanche photodiode.

FIG. 6 illustrates a graph similar to FIG. 5 for the vertical and horizontal axis and again shows the standard DC bias curve 110. As illustrated, the full, or 100%, modulation is indicated by a boxed, data point curve 118, while 50% modulation is represented by an X data point curve 116. FIG. 6 illustrates that at the higher gains, the noise is less for maximum modulation than it is for a lesser value of modulation. However, at the gains of less than 9, for this particular avalanche photodiode, there is a slightly reduced amount of noise in the lower modulation situation than with maximum modulation.

FIG. 7 again uses the same scale as FIG. 5 and illustrates the varying noise levels from the aspect of frequency of modulation, where the modulating signal is not synchronized with the optical signal but is of a substantially higher frequency than any modulation of the optical signal. An X data point curve 120 represents the noise for a high frequency modulation such as 5 GHz. A box data point curve 122 illustrates the noise conditions with very high frequency modulation such as a 10 GHz modulation signal. It will be noted that the higher frequency modulation produces less avalanche photodiode noise than does the lower modulation frequency.

Figure 8:
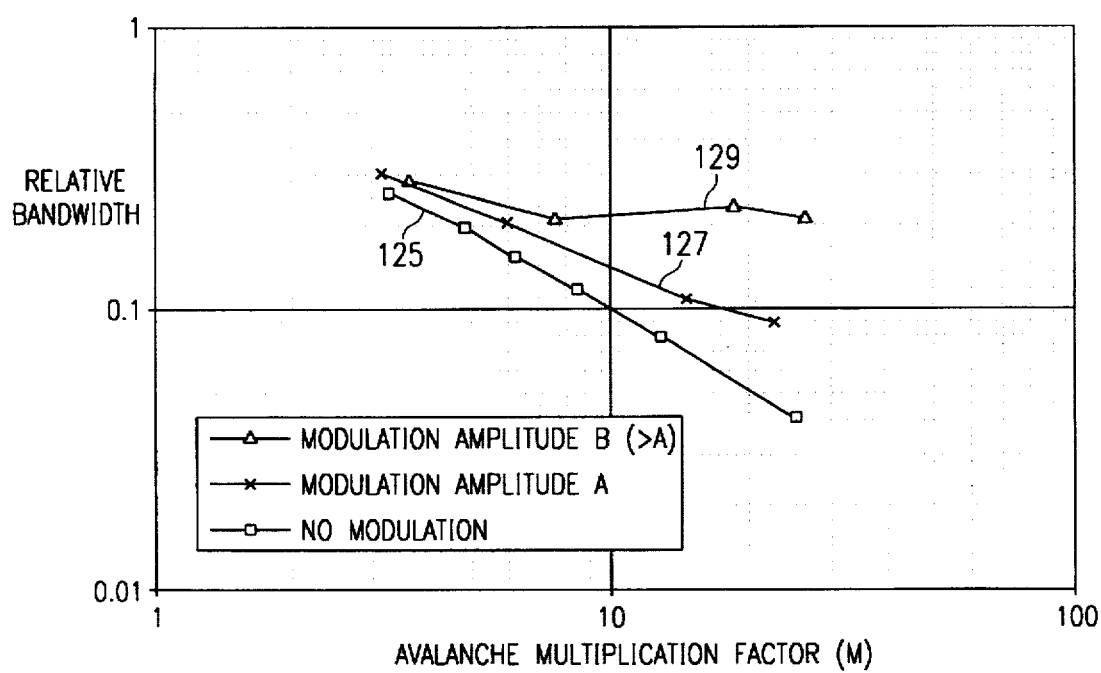
FIG. 8 is a graph for illustrating the relative changes in bandwidth for various modulation amplitudes.

FIG. 8 illustrates a logarithmic curve where the horizontal axis is avalanche multiplication factor or gain, as in the previous FIGS. 5 through 7, but the vertical axis is indicative of relative bandwidth. A box-line curve 125, illustrates the prior art situation with no modulation (or in other words, a DC bias signal only) and the bandwidth is shown to decrease for an increase in gain. An X data point curve 127 shows a situation with some modulation, and a triangle data point curve 129 shows a situation where the modulation is greater than that of 127. As will be noted, for a typical prior art gain of 20, the relative bandwidth for the modulation of curve 129 shows that the bandwidth is greater than 0.2, whereas for the DC bias condition of curve 125, the relative bandwidth is 0.05. In other words, the bandwidth is roughly four times as wide using the modulation indicated by curve 129 than would be obtained for that gain using the prior art DC bias 125.

The embodiments of the present invention improve upon the prior art by producing enhanced characteristics from the overall circuit. When a repetitive modulating voltage waveform is applied to the DC bias voltage of an avalanche photodiode circuit (to which an optical signal is applied), there is a change in the optical-to-electrical properties of the circuit. Particularly, there are beneficial effects in an embodiment where the modulation frequency is a high frequency such as at least 1 GHz or at a very high frequency of 10 GHz or greater. The amount of change is dependent on the amplitude and frequency of the modulating waveform. When the modulation amplitude is increased, the average gain is normally increased; however, when the frequency of the modulating waveform is very large, the increase in gain may be reduced or there can even be a decrease in average gain. The modulation of the bias signal for the avalanche photodiode enhances the characteristics of the avalanche photodiode and thus of the signal as output by the avalanche photodiode circuit. In other words, as compared to a prior art unmodulated avalanche photodiode circuit, the output signal for a given input signal is at least one of less noisy, higher amplitude, and greater bandwidth.

If a prior art circuit configuration is compared to a circuit configuration of the present invention at the same average conversion gain, it has been found that the present invention configuration is greater in bandwidth and lower in noise than the prior art configuration.

Note also that while the modulation of the DC bias to the avalanche photodiode improves its characteristics with a steady state or varying optical signal, the increased gain and reduced noise are even more pronounced in the situation of a narrow pulse optical signal, such as a return-to-zero (RZ) modulated optical signal or a soliton signal used in conjunction with a synchronous modulation of the bias signal (i.e., FIG. 3 embodiment). With a narrow pulse optical signal, synchronization of the modulation signal and narrow pulse optical signal can provide for overlapping of the signal pulse and the peaks of the modulation signal during any given period. Adjustment of the phase of the modulation signal to provide for overlapping may be necessary. Preferably, the phase of the modulation signal is adjusted such that the narrow optical pulses arrive at the avalanche photodiode coincidentally or approximately or nearly coincidentally with the peaks of the modulation signal. Since the gain is most pronounced near the peaks of the modulation signal, the narrow signal pulse will have optimum gain. In one embodiment of the present invention, the improvement in gain was in the neighborhood of 20 dB where the modulating signal for the DC bias was synchronous with the modulation of the optical signal.

From the above, it may be appreciated that the embodiments of the present invention significantly improve upon various drawbacks of the prior art. Moreover, the above demonstrates various alternative embodiments depicting the scope of the present invention, including specific examples of how the concepts may be applied. As yet another example, while the modulation signal waveform in the preferred embodiment is described as a sine wave, it could be any other repetitive waveform for certain applications such as a square wave, triangular or whatever. Consequently, while the present invention has been described in detail, various substitutions, modifications or alterations could be made to the descriptions set forth above without departing from the invention which is defined by the following claims.

What is claimed is:

1. A photodetector circuit, comprising:
    an avalanche photodiode having a signal input for receiving an input optical signal to be converted to an electrical signal;
    biasing circuitry, coupled to said avalanche photodiode, for applying a bias voltage to said avalanche photodiode; and
    wherein said bias voltage comprises a dc component for maintaining said avalanche photodiode in a stable avalanche gain condition when receiving said input optical signal and a high frequency modulating component for enhancing output characteristics of the avalanche photodiode.

2. The photodetector circuit of claim 1 wherein said input optical signal comprises an optical pulse stream operating at a first pulse repetition frequency, and wherein said high frequency modulating component operates at a second frequency equal to said first pulse repetition frequency.

3. The photodetector circuit of claim 1 wherein said input optical signal comprises an optical pulse stream operating at a first pulse repetition frequency, and wherein said high frequency modulating component operates at a second frequency substantially greater than said first frequency.

4. The photodetector circuit of claim 2 wherein said input optical signal comprises an optical pulse stream with narrow pulses and wherein said high frequency modulating component has a phase such that the narrow pulses overlap the peaks of the high frequency modulating component.

5. The photodetector circuit of claim 1 wherein frequency components of intensity modulation of said input optical signal operates at a first range of frequencies, and wherein said high frequency modulating component operates at a second frequency substantially greater than said first range of frequencies.

6. The photodetector circuit of claim 1 wherein said avalanche photodiode has a reverse-bias breakdown voltage, and wherein said bias voltage comprising said dc and high frequency modulating components periodically exceeds said reverse-bias breakdown voltage.

7. The photodetector circuit of claim 1 and further comprising filtration circuitry, connected to an output of said avalanche photodiode, for removing modulation frequency components in a signal output of said avalanche photodiode.

8. The photodetector circuit of claim 7 wherein the filtration circuitry comprises a matching circuit.

9. The photodetector circuit of claim 1 wherein said input signal has a first pulse width, and wherein said high frequency modulating component has a second pulse width substantially equal to said first pulse width.

10. The photodetector circuit of claim 9 wherein said high frequency modulating component has a phase such that the first pulse width of said input signal overlaps the second pulse width of said high frequency modulating component.

11. The photodetector circuit of claim 1 wherein said biasing circuitry comprises:
    a dc bias circuit for providing the dc component to said bias voltage; and
    a modulating circuit for providing the high frequency modulating component to said bias voltage.

12. The photodetector circuit of claim 1 wherein said high frequency modulating component to said bias voltage increases the gain of a signal output of the avalanche photodiode.

13. The photodetector of claim 12 wherein said high frequency modulating component to said bias increases the gain of the output signal of the avalanche photodiode by at least 5 decibels.

14. The photodetector circuit of claim 1 wherein said high frequency modulating component to said bias voltage decreases the noise for a given average gain of an output signal of the avalanche photodiode.

15. The photodetector circuit of claim 1 wherein said high frequency modulating component to said bias voltage increases the bandwidth for a given gain of an output signal of the avalanche photodiode.

16. The photodetector circuit of claim 11 wherein said modulating circuit comprises:
    a modulating source having an output for outputting a modulating signal; and
    a filter connected to said output of said modulating source and to said avalanche diode.

17. The photodetector circuit of claim 11 and further comprising means for synchronizing said high frequency modulating component with said electrical signal.

18. The photodetector circuit of claim 1 and further comprising:
    a signal amplifier coupled to receive a signal output from said avalanche diode; and
    a filter coupled to receive a signal output from said signal amplifier.

19. A photodetector circuit for converting an input optical signal to an output electrical signal, comprising:
    an avalanche photodiode having a signal input for receiving the input optical signal to be converted to the output electrical signal;
    biasing circuitry, coupled to said avalanche photodiode, for applying a bias voltage to said avalanche photodiode and comprising:

a dc bias circuit for providing a dc component to said bias voltage for maintaining said avalanche photodiode in a stable avalanche gain condition when receiving said input optical signal; and a modulating circuit for providing a modulating component to said bias voltage for modulating the bias voltage in a manner that enhances the output characteristics of the output electrical signal of the avalanche photodiode.

20. The photodetector circuit of claim 19 wherein said input optical signal comprises an optical pulse stream operating at a first pulse repetition frequency, and wherein said modulating component operates at a second frequency equal to said first pulse repetition frequency.

21. The photodetector circuit of claim 20 wherein said input optical signal comprises an optical pulse stream with narrow pulses and wherein said modulating component has a phase such that the narrow pulses overlap the peaks of said modulating component.

22. The photodetector circuit of claim 19 wherein said input optical signal comprises an optical pulse stream operating at a first pulse repetition frequency, and wherein said modulating component operates at a second frequency substantially greater than said first pulse repetition frequency.

23. The photodetector circuit of claim 19 wherein the frequency component of intensity modulation of said input optical signal operates at a first range of frequencies and wherein said modulating component operates at a second frequency substantially greater than said first range of frequencies.

24. The photodetector circuit of claim 19 wherein said avalanche photodiode has a reverse-bias breakdown voltage, and wherein said dc component is equal to or less than said reverse-bias breakdown voltage and said modulating component periodically exceeds said reverse-bias breakdown voltage.

25. The photodetector circuit of claim 19 and further comprising filtration means, connected to an output of said avalanche diode, for removing modulation frequency components in a signal output of said avalanche diode.

26. The photodetector circuit of claim 19 wherein said modulating component of said bias voltage increases the average gain of an output signal to the avalanche photodiode for a given DC bias voltage, decreases the noise for a given average gain of the output signal to the avalanche photodiode, and increases the bandwidth for a given average gain of the output signal of the avalanche photodiode.

27. The photodetector circuit of claim 19 wherein the noise for a given gain of the output signal to the avalanche photodiode decreases as a function of increasing frequency of said modulating component to said bias voltage within a certain operating range.

28. A method of detecting an optical signal, comprising the steps of:

receiving an optical signal by an avalanche photodiode circuit;

applying a bias voltage to the avalanche photodiode circuit; and generating a signal output;

wherein the bias voltage includes a dc component for maintaining said avalanche photodiode circuit in a stable avalanche gain condition when receiving said optical signal; and wherein the bias voltage further includes a high frequency modulating component for enhancing the output characteristics of the signal output of the avalanche photodiode.

29. The photodetector circuit of claim 28 wherein the frequency components of intensity modulation of said input optical signal operates at a first range of frequencies, and wherein said high frequency modulating component operates at a second frequency substantially greater than said first range of frequencies.

30. The method of claim 29 wherein said high frequency modulating component of the bias voltage decreases the noise and increases the bandwidth of the output signal for a given average gain.

* * * * *